(12) United States Patent
Mizushiro

(10) Patent No.: US 11,682,519 B2
(45) Date of Patent: Jun. 20, 2023

(54) INDUCTOR COMPONENT AND METHOD FOR MANUFACTURING THE SAME

(71) Applicant: Murata Manufacturing Co., Ltd., Kyoto (JP)

(72) Inventor: Masaaki Mizushiro, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1537 days.

(21) Appl. No.: 15/888,356

(22) Filed: Feb. 5, 2018

(65) Prior Publication Data

US 2018/0158607 A1    Jun. 7, 2018

Related U.S. Application Data

(63) Continuation of application No. PCT/JP2016/072884, filed on Aug. 4, 2016.

(30) Foreign Application Priority Data

Aug. 5, 2015  (JP) .............................. JP2015-155106

(51) Int. Cl.
*H01F 27/28* (2006.01)
*H01F 41/04* (2006.01)
(Continued)

(52) U.S. Cl.
CPC ....... *H01F 41/041* (2013.01); *H01F 17/0013* (2013.01); *H01F 17/062* (2013.01);
(Continued)

(58) Field of Classification Search
CPC .. H01F 41/041; H01F 17/062; H01F 17/0013; H01F 27/24; H01F 27/2804;
(Continued)

(56) References Cited

U.S. PATENT DOCUMENTS 5,055,321 A * 10/1991 Enomoto ................ C23C 18/24
                                                               427/97.2
5,589,250 A * 12/1996 Asai .......................... G03F 7/11
                                                                 361/748
(Continued)

FOREIGN PATENT DOCUMENTS

JP  2001-052937 A  2/2001
JP  2010-080862 A  4/2010
(Continued)

OTHER PUBLICATIONS

International Search Report for PCT/JP2016/072884 dated Sep. 6, 2016.
Written Opinion for PCT/JP2016/072884 dated Sep. 6, 2016.

*Primary Examiner* — Mang Tin Bik Lian
(74) *Attorney, Agent, or Firm* — Pearne & Gordon LLP

(57) ABSTRACT

A coil electrode included in an inductor component includes a plurality of metal pins upper end surfaces of which are exposed to the upper surface of a resin layer and lower end surfaces of which are exposed to a lower surface of the resin layer, and a plurality of wiring patterns that connect the upper end surfaces or the lower end surfaces of the predetermined metal pins, wherein surface roughnesses of the upper surface and the lower surface of the resin layer are larger than surface roughnesses of the upper end surfaces and the lower end surfaces of the respective metal pins, and wiring patterns are respectively formed on the upper and lower surfaces of the resin layer by plating.

23 Claims, 4 Drawing Sheets

(51) Int. Cl.
  *H05K 1/16* (2006.01)
  *H01F 17/06* (2006.01)
  *H01F 17/00* (2006.01)
  *H01F 27/24* (2006.01)
  *H01F 27/29* (2006.01)
(52) U.S. Cl.
  CPC ......... *H01F 27/24* (2013.01); *H01F 27/2804* (2013.01); *H01F 27/29* (2013.01); *H05K 1/16* (2013.01); *H01F 2027/2809* (2013.01)
(58) Field of Classification Search
  CPC ............ H01F 27/29; H01F 2027/2809; H01F 27/2828; H05K 1/16
  See application file for complete search history.

(56) References Cited

U.S. PATENT DOCUMENTS

| | | | |
|---|---|---|---|
| 6,365,843 B1 * | 4/2002 | Shirai | H05K 1/113 174/262 |
| 7,196,607 B2 * | 3/2007 | Pleskach | H01F 17/0033 257/E23.062 |
| 2003/0206089 A1 | 11/2003 | Shikama et al. | |
| 2004/0135662 A1 * | 7/2004 | Harding | H01F 17/0006 336/229 |
| 2007/0290783 A1 * | 12/2007 | Whittaker | H01F 41/046 336/229 |
| 2009/0002111 A1 * | 1/2009 | Harrison | H01F 19/04 336/69 |
| 2011/0108317 A1 * | 5/2011 | Harrison | H01F 17/0033 174/266 |
| 2012/0058676 A1 * | 3/2012 | Schaffer | H01F 17/0013 439/620.21 |
| 2014/0266549 A1 * | 9/2014 | Huang | H05K 1/165 336/200 |
| 2015/0262748 A1 * | 9/2015 | Nishihata | H01F 27/29 336/192 |

FOREIGN PATENT DOCUMENTS

| | | |
|---|---|---|
| JP | 2011-258609 A | 12/2011 |
| JP | 2014-154712 A | 8/2014 |

* cited by examiner

INDUCTOR COMPONENT AND METHOD FOR MANUFACTURING THE SAME

This is a continuation of International Application No. PCT/JP2016/072884 filed on Aug. 4, 2016 which claims priority from Japanese Patent Application No. 2015-155106 filed on Aug. 5, 2015. The contents of these applications are incorporated herein by reference in their entireties.

BACKGROUND

Technical Field

The present disclosure relates to an inductor component including a resin layer and an inductor electrode and a method for manufacturing the same.

In an electronic apparatus using a high-frequency signal, an inductor component is used as a component for preventing noise in some cases. Among components of this type, there is an inductor component in which an inductor electrode is configured by a columnar conductor provided in a resin layer in a standing manner and a wiring electrode formed on the surface of the resin layer. In this case, the columnar conductor is formed by a via conductor, a metal pin, or the like, and the wiring electrode is formed by a print pattern using conductive paste, for example. In recent years, formation of the wiring electrode by plating has been examined in order to improve characteristics by suppressing a resistance value of the inductor electrode to be low. A plating film contains a small amount of non-metal component such as an organic solvent like the conductive paste, thereby lowering resistance of the wiring electrode. However, there is a problem that the plating formed on the resin layer is easy to be peeled. To cope with this problem, an existing technique of reducing peeling, from a resin layer, of a wiring electrode formed on the surface of the resin layer by plating has been proposed as illustrated in FIG. 8 (see Patent Document 1).

In this case, a printed wiring substrate 100 has an inner layer circuit substrate 101 formed with glass epoxy resin or the like, a resin layer 102 laminated on an upper surface 101a of the inner layer circuit substrate 101, and wiring electrodes 103 formed on the resin layer 102 by plating. The wiring electrodes 103 are formed by forming, by non-electrolytic plating, metal films of copper or the like on wall surfaces of grooves 102a formed in the surface of the resin layer 102, and then, embedding inner portions of the grooves 102a by electrolytic plating using the metal films as feeding films. With this formation manner, a contact area between the resin layer 102 and the wiring electrodes 103 can be increased and peeling of the wiring electrodes 103 from the resin layer 102 can therefore be reduced in comparison with the case in which the wiring electrode is simply plated on the surface of the resin layer 102.

Patent Document 1: Japanese Unexamined Patent Application Publication No. 2010-80862 (see paragraphs 0049 to 0050, FIGS. 6 to 8, and the like)

BRIEF SUMMARY

However, even when a wiring electrode of an inductor component is formed by a method similar to the existing method for forming the printed wiring substrate 100, a close contact force itself of the plating film (wiring electrode) on the resin layer is not changed and there is therefore a risk that the wiring electrode is peeled due to external stress and heat stress.

The present disclosure provides an inductor component that is excellent in characteristics and reliability.

According to an aspect of the present disclosure, an inductor component includes a resin layer and an inductor electrode, wherein the inductor electrode includes a first columnar conductor arranged in the resin layer in a state in which an end surface is exposed to a main surface of the resin layer, and a plating layer having a portion making contact with the end surface of the first columnar conductor and a portion making contact with the main surface of the resin layer, and surface roughness of the main surface of the resin layer is larger than surface roughness of the end surface of the first columnar conductor.

With this configuration, the portion of the inductor electrode, which is formed on the main surface of the resin layer, is formed by the plating layer. This can lower resistance of the inductor electrode in comparison with the case in which the portion is formed by conductive paste, thereby improving characteristics of the inductor electrode, such as a Q value thereof.

Furthermore, close contact strength of the plating layer with the main surface of the resin layer is increased by making the main surface of the resin layer coarse. Therefore, peeling of the plating layer from the resin layer, which is a harmful effect when the portion (plating layer) is formed by a plating film, can be reduced. On the other hand, when the end surface of the columnar conductor is coarse, cavities are generated in a connection portion with the plating layer in some cases. In the aspect of the present disclosure, the roughness of the end surface of the columnar conductor is however decreased to be smaller than that of the main surface of the resin layer. Accordingly, decrease in connection strength between the plating layer and the columnar conductor, increase in connection resistance therebetween, heat generation and disconnection at the time of energization, and the like, which are caused by the cavities generated in the connection portion between the plating layer and the columnar conductor, can be prevented. Furthermore, in general, the close contact strength between the resin layer and the plating layer is smaller than close contact strength between the columnar conductor and the plating layer. With the aspect of the present disclosure, connection between the columnar conductor and the plating layer can be kept while increasing the close contact performance between the resin layer and the plating layer by making the main surface of the resin layer coarser than the end surface of the columnar conductor.

Furthermore, the plating layer may have a first metal film arranged on the main surface of the resin layer and a second metal film laminated on the first metal film. With this configuration, the total thickness of the plating layer can be easily increased by, for example, forming the first metal film by non-electrolytic plating and forming the second metal film by electrolytic plating.

The plating layer and the first columnar conductor can contain the same metal as main components. With this configuration, connection resistance between the plating layer and the columnar conductor can be reduced and connection reliability therebetween can be improved.

Furthermore, the main components may be copper. With this configuration, direct-current (DC) resistance of the inductor electrode can be reduced and the connection resistance between the plating layer and the columnar conductor can be further reduced.

The inductor electrode may further include a second columnar conductor arranged in the resin layer in a state in which an end surface is exposed to the main surface of the resin layer, and the plating layer may further have a portion making contact with the end surface of the second columnar conductor and connect the first columnar conductor and the second columnar conductor. In this case, resistance of the inductor electrode configured by the first and second columnar conductors and the plating layer connecting these conductors can be lowered and peeling of the plating layer from the resin layer can be reduced. In addition, the end surfaces of the first and second columnar conductors are not coarser than the main surface of the resin layer. Accordingly, decrease in connection strengths between the plating layer and the columnar conductors, increases in connection resistances therebetween, heat generation and disconnection at the time of energization, and the like, which are caused by cavities generated in connection portions between the plating layer and the first and second columnar conductors, can be prevented.

Moreover, a coil core may be arranged between the first columnar conductor and the second columnar conductor. In this case, an inductance value of the inductor electrode can be easily increased.

Furthermore, the plating layer may have a cross-sectional shape of being enlarged in a direction of being farther from the main surface of the resin layer. With this configuration, heat generated in the connection portions between the first and second columnar conductors and the plating layer is easy to be dissipated in the enlarged direction at the time of energization of the inductor electrode, thereby improving heat dissipation characteristics of the inductor component. In addition, increase in a resistance value of the inductor electrode due to heat at the time of energization can be suppressed.

Moreover, the first columnar conductor may be a metal pin. The metal pin is formed by performing shearing processing or the like on a metal wire, and therefore specific resistance of the metal pin is lower than those of a via conductor, a post electrode, and the like. Accordingly, resistance of the overall inductor electrode can be lowered and inductor characteristics such as a Q value, for example, can be improved.

According to another aspect of the present disclosure, a method for manufacturing an inductor component that includes a resin layer and an inductor electrode having a first columnar conductor arranged in the resin layer and a wiring electrode formed on a main surface of the resin layer, includes arranging the first columnar conductor in the resin layer containing a filler, polishing or grinding the main surface of the resin layer to expose an end surface of the first columnar conductor to the main surface, and forming the wiring electrode having a portion making contact with the end surface of the first columnar conductor and a portion making contact with the main surface of the resin layer on the main surface of the resin layer by plating, wherein in the polishing or grinding, the filler in the main surface of the resin layer is shed at the time of polishing or grinding to make surface roughness of the main surface of the resin layer be larger than surface roughness of the end surface of the first columnar conductor.

With this configuration, the filler in the resin layer is shed at the time of polishing or grinding to make the surface roughness of the main surface of the resin layer be larger than the surface roughness of the end surface of the first columnar conductor. Therefore, difference in the surface roughness between the main surface of the resin layer and the end surface of the first columnar conductor can be easily achieved. Accordingly, the inductor component that is excellent in characteristics such as the Q value, for example, and environment reliability can be easily manufactured.

Furthermore, the forming of the wiring electrode may include forming a first metal film coating a substantially all of the main surface of the resin layer by non-electrolytic plating, laminating a second metal film on the first metal film by electrolytic plating, coating, with a resist film, a region of the second metal film in which the wiring electrode is formed, and removing a portion of the first metal film and the second metal film, which is coated with no resist film, by etching.

In this case, the wiring electrode on the main surface of the resin layer with no feeding film is formed by the non-electrolytic plating (first metal film), and the second metal film is formed by the electrolytic plating using the first metal film as the feeding film. Therefore, the wiring electrode on the resin layer can be formed only by plating and the film thickness of the wiring electrode can be easily increased with the second metal film laminated on the first metal film. With this method for forming the wiring electrode, no corner is formed in end portions of the wiring electrode and the end portions form gently curved surfaces. Therefore, stress when the inductor electrode thermally expands at the time of energization can be dispersed by the curved surfaces of the end portions of the wiring electrode.

Moreover, the forming of the wiring electrode may include forming a first metal film coating a substantially all of the main surface of the resin layer by non-electrolytic plating, coating, with a resist film, a portion of the first metal film other than a portion in which the wiring electrode is to be formed, laminating a second metal film on a portion of the first metal film, which is coated with no resist film, by electrolytic plating, removing the resist film, and removing a portion of the first metal film, which has been coated with the resist film, by etching.

In this case, the resist film coats the portion of the first metal film other than the portion in which the wiring electrode is to be formed. That is to say, an opening having a shape of the wiring electrode is formed in the resist film. In this case, the portion of the resist film, which forms the opening, spreads out with a predetermined contact angle with surface tension and the like. When the opening is embedded with the second metal film, a cross section of the wiring electrode can be made to have a shape of being enlarged in the direction of being farther from the main surface of the resin layer. In this case, heat generated in the connection portion between the first columnar conductor and the wiring electrode is easy to be dissipated in the enlarged direction of the wiring electrode at the time of energization of the inductor electrode, thereby being capable of manufacturing the inductor component that is excellent in heat dissipation characteristics.

Moreover, the forming of the wiring electrode may include forming a first metal film coating a substantially all of the main surface of the resin layer by non-electrolytic plating, coating, with a resist film, a portion of the first metal film in which the wiring electrode is to be formed, removing a portion of the first metal film, which is coated with no resist film, by etching, removing the resist film, and laminating a second metal film on a portion of the first metal film, which remains in the etching, by electrolytic plating.

With this method for forming the wiring electrode, no corner is formed in end portions of the wiring electrode and the end portions form gently curved surfaces. Therefore, stress when the inductor electrode thermally expands at the time of energization can be dispersed by the curved surfaces of the end portions of the wiring electrode.

According to the present disclosure, the portion of the inductor electrode, which is formed on the main surface of the resin layer, is formed by the plating layer. This can lower the resistance of the inductor electrode in comparison with the case in which the portion is formed by conductive paste, thereby improving the characteristics of the inductor electrode, such as the Q value. Furthermore, the close contact strength of the plating layer with the main surface of the resin layer is increased by making the main surface of the resin layer coarse. Therefore, peeling of the plating layer from the resin layer can be reduced. In addition, the end surface of the columnar conductor is not coarser than the main surface of the resin layer. Accordingly, decrease in the connection strength between the plating layer and the columnar conductor, increase in the connection resistance therebetween, heat generation and disconnection at the time of energization, and the like, which are caused by cavities generated in the connection portion between the plating layer and the columnar conductor, can be prevented.

DETAILED DESCRIPTION

First Embodiment

Figure 1:
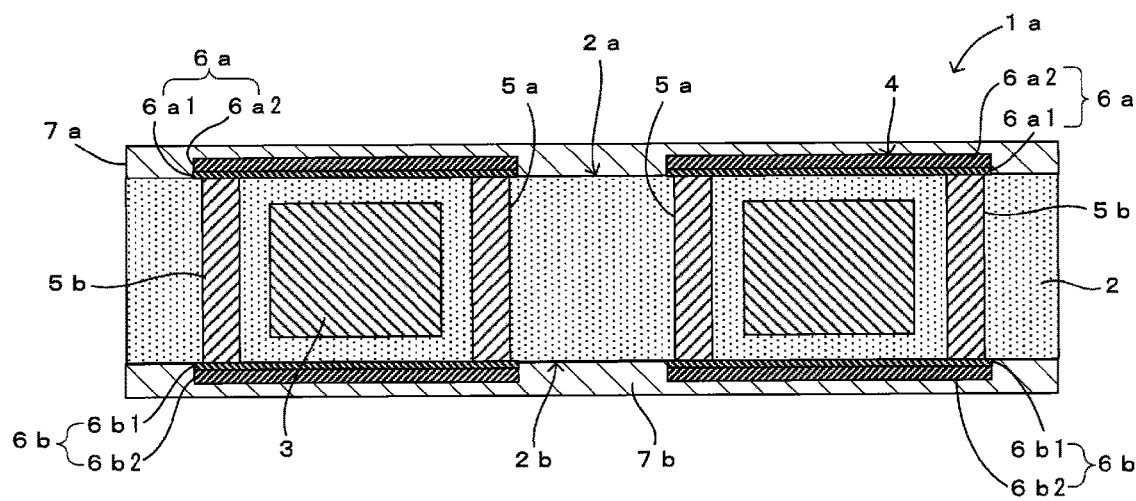
FIG. 1 is a cross-sectional view of an inductor component according to a first embodiment of the present disclosure.
Figure 2:
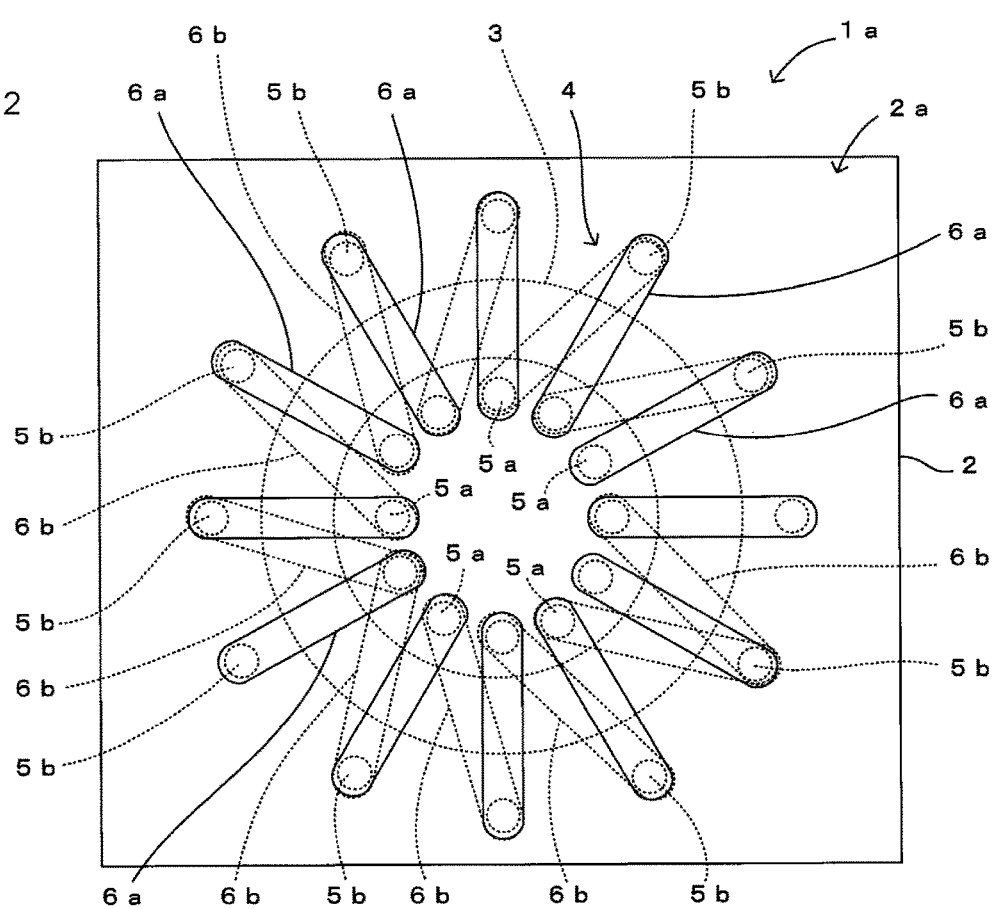
FIG. 2 is a plan view of the inductor component in FIG. 1.
Figure 3:
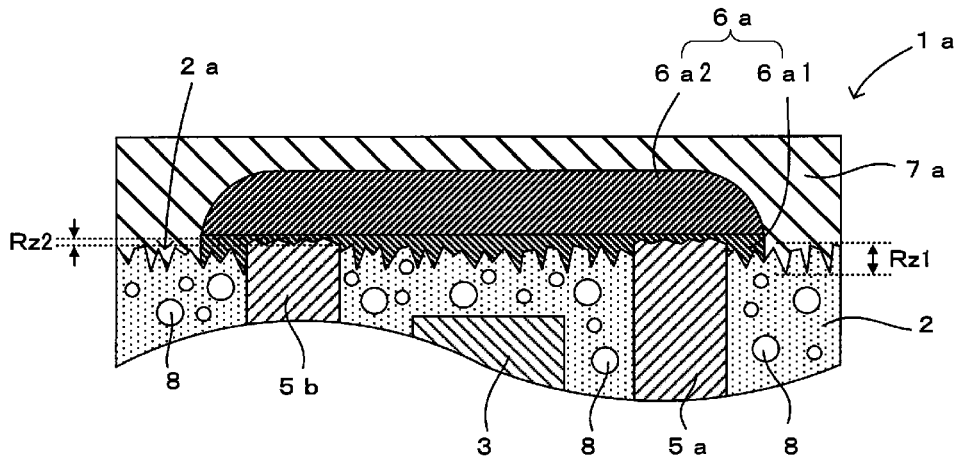
FIG. 3 is a partial cross-sectional view of the inductor component in FIG. 1.

An inductor component according to a first embodiment of the present disclosure will be described with reference to FIG. 1 to FIG. 3. FIG. 1 is a cross-sectional view of the inductor component, FIG. 2 is a plan view of the inductor component, and FIG. 3 is a partial cross-sectional view of the inductor component. Insulating coating films 7a and 7b are not illustrated in FIG. 2.

As illustrated in FIG. 1 to FIG. 3, an inductor component 1a in the embodiment includes a resin layer 2 in which a coil core 3 is buried, and a coil electrode 4 (corresponding to an "inductor electrode" in the present disclosure) wound around the coil core 3, and is mounted on an electronic apparatus such as a cellular phone using a high-frequency signal.

The resin layer 2 is formed with resin such as epoxy resin, for example, and the coil core 3 and a plurality of metal pins 5a and 5b, which will be described later, are arranged therein. In the embodiment, the resin layer 2 is formed with epoxy resin containing a filler 8 and both of main surfaces (upper surface 2a and lower surface 2b) thereof are formed into rectangular shapes. The filler 8 may be made of an inorganic material such as silica and alumina or an organic material but a material making the resin layer 2 after being solidified have lower malleability and ductility and smaller mechanical strength than those of the metal pins 5a and 5b can be selected.

The coil core 3 is formed with a magnetic material that is employed for a general coil core, such as Mn—Zn ferrite. It should be noted that the coil core 3 in the embodiment is formed into an annular shape.

The coil electrode 4 includes the plurality of metal pins 5a and 5b arranged around the coil core 3 in a state in which the respective upper end surfaces thereof are exposed to the upper surface 2a of the resin layer 2 and the respective lower end surfaces thereof are exposed to the lower surface 2a of the insulating film 2. The respective metal pins 5a and 5b are formed with a metal material that is generally employed for a wiring electrode, such as Cu, Au, Ag, Al, Fe, and Cu-based alloys (for example, Cu—Ni alloy) and the like. It should be noted that the respective metal pins 5a and 5b can be formed by performing shearing processing or the like on a metal wire formed with any of these metal materials.

As illustrated in FIG. 2, the metal pins 5a and 5b are configured by the plurality of inner metal pins 5a aligned along the inner circumferential surface of the coil core 3 and the plurality of outer metal pins 5b aligned along the outer circumferential surface of the coil core 3 so as to form a plurality of pairs with the respective inner metal pins 5a. Each of the metal pins 5a and 5b corresponds to a "first or second columnar conductor" in the present disclosure. In the embodiment, the respective metal pins 5a and 5b are formed to have transverse cross sections (cross sections in the direction perpendicular to the lengthwise direction of the metal pins) of circular shapes but the transverse cross sections are not limited to the circular shapes and can be employed various shapes such as rectangular shapes, for example. For example, via conductors or post electrodes can also be used instead of the metal pins 5a and 5b.

The upper end surface of the inner metal pin 5a and the upper end surface of the outer metal pin 5b, which form each pair, are connected to each other with one upper wiring pattern 6a provided on the upper surface 2a of the resin layer 2. The lower end surface of the inner metal pin 5a and the lower end surface of the outer metal pin 5b which is adjacent, at a predetermined side (in FIG. 2, clockwise direction side), to the outer metal pin 5b forming the pair with the inner metal pin 5a are connected to each other with one lower wiring pattern 6b formed on the lower surface 2b of the resin layer 2.

In this case, the respective upper wiring patterns 6a are aligned in the winding axis direction of the coil electrode 4 (circumferential direction of the coil core 3) in a state in which one ends thereof are arranged at the inner circumferential side of the coil core 3 and the other ends thereof are arranged at the outer circumferential side of the coil core. In the same manner, the respective lower wiring patterns 6b are aligned in the winding axis direction of the coil electrode 4 in a state in which one ends thereof are arranged at the inner circumferential side of the coil core 3 and the other ends thereof are arranged at the outer circumferential side of the coil core. In this case, the respective wiring patterns 6a and 6b have portions making contact with the metal pins 5a and 5b (connection portions) and portions making contact with the upper or lower surface 2a or 2b of the resin layer 2. It should be noted that each of the upper and lower wiring patterns 6a and 6b corresponds to a "plating layer" in the present disclosure.

Both of the wiring patterns 6a and 6b are respectively formed by two-layer structures of first metal films 6a1 and 6b1 that are formed by metal plating (non-electrolytic plating) of Cu, Ag, Al, or the like and second metal films 6a2 and 6b2 that are also formed by metal plating (electrolytic plating) of Cu, Ag, Al, or the like and are laminated on the first metal films 6a1 and 6b1. In the embodiment, all of the first and second metal films 6a1, 6b1, 6a2, and 6b2 are formed with metal containing Cu as main components. The connecting structure with the metal pins 5a and 5b, the upper wiring patterns 6a, and the lower wiring patterns 6b forms the coil electrode 4 wound around the annular coil core 3 in a spiral form.

The insulating coating films 7a and 7b for protecting the respective upper and lower wiring patterns 6a and 6b are respectively laminated on the upper and lower surfaces 2a and 2b of the resin layer 2. The insulating coating films 7a and 7b can be formed with, for example, epoxy resin, polyimide resin, or the like.

As illustrated in FIG. 3, the upper and lower surfaces 2a and 2b of the resin layer 2 are formed to have large surface roughnesses in order to provide desired close contact strengths of the respective wiring patterns 6a and 6b with the resin layer 2. In this case, the upper and lower surfaces 2a and 2b of the resin layer 2 are formed to have larger surface roughnesses Rz1 than the surface roughnesses Rz2 of the upper and lower end surfaces of the inner and outer metal pins 5a and 5b (Rz1>Rz2). Although ten-point average roughness (Rz) is used for comparison of the surface roughness in the embodiment, it is sufficient that the surface roughnesses of the upper and lower surfaces 2a and 2b are larger than the surface roughnesses of the inner and outer metal pins 5a and 5b for at least one of the ten-point average roughness Rz and arithmetic average roughness Ra.

(Method for Manufacturing Inductor Component 1a)

Next, an example of a method for manufacturing the inductor component 1a will be described. First, after the respective metal pins 5a and 5b are provided in a standing manner at predetermined positions on the main surface of a support substrate, resin containing the filler 8 is made to flow into contact portions between the support substrate and the respective pins 5a and 5b and is solidified, thereby fixing the respective metal pins 5a and 5b onto the main surface of the support substrate. In this case, the resin may be thermosetting resin or thermoplastic resin but the thermosetting epoxy resin is used in the embodiment. Both of the metal pins 5a and 5b in the embodiment are formed with metal containing Cu as a main component.

Then, the coil core 3 is arranged in a region between an alignment circle (inner circumferential circle) of the respective inner metal pins 5a and an alignment circle (outer circumferential circle) of the respective outer metal pins 5b.

Subsequently, resin that is the same type of the above-described resin is made to flow to the main surface of the support substrate until the respective metal pins 5a and 5b and the coil core 3 are buried therein (arrangement process).

Then, after the support substrate is removed, the upper and lower surfaces of the resin in which the respective metal pins 5a and 5b and the coil core 3 have been buried are polished or ground to form the resin layer 2 (polishing/grinding process). In this case, the upper and lower end surfaces of the respective metal pins are respectively exposed to the upper and lower surfaces 2a and 2b of the resin layer 2 and the resin layer 2 becomes being flush with the metal pin surfaces. A polishing or grinding material of the number of equal to or lower than #600 is used to shed the filler 8 in the upper and lower surfaces 2a and 2b of the resin layer 2 or increase the polishing or grinding amount of resin so as to make the surface roughnesses Rz1 of the upper and lower surfaces 2a and 2b of the resin layer 2 be larger than the surface roughnesses Rz2 of the upper and lower end surfaces of the respective metal pins 5a and 5b.

After that, first copper films (corresponding to a "first metal film" in the present disclosure) are formed on the substantially all of the upper and lower surfaces 2a and 2b of the resin layer 2 by non-electrolytic plating. In this case, the films are formed on not only the upper and lower surfaces 2a and 2b of the resin layer 2 but also the side surfaces thereof.

Subsequently, second copper films (corresponding to a "second metal film" in the present disclosure) are laminated on the first copper films by electrolytic plating using the first copper films as feeding films.

Then, resist films are pattern-formed so as to coat regions of the second copper films in which the upper or lower wiring pattern 6a or 6b is formed on the respective upper and lower surfaces 2a and 2b of the resin layer 2. This pattern formation can be performed using a printing method or an exposure method.

After that, the first and second copper films that are coated with no resist film are subject to wet etching by an etching solution to form the respective upper and lower wiring patterns 6a and 6b. Processes to the etching from the process of forming the first copper films correspond to a "wiring electrode formation process" in the present disclosure.

Then, the resist films are removed by a wet or dry process and the insulating coating films 7a and 7b for protecting the respective wiring patterns 6a and 6b are respectively laminated on the upper and lower surfaces 2a and 2b of the resist layer 2 to complete the inductor component 1a.

Accordingly, with the above-described embodiment, the wiring electrodes are formed by plating. Therefore, the resistance of the coil electrode 4 can be lowered and characteristics of the coil electrode 4, such as the Q value, can be improved in comparison with the case in which the wiring electrodes are formed by conductive paste. Moreover, the respective upper and lower wiring patterns 6a and 6b are connected to each other with the metal pins 5a and 5b containing larger amounts of metal component than via conductors, thereby further lowering the resistance of the coil electrode 4.

Furthermore, close contact strengths of the respective wiring patterns 6a and 6b with the resin layer 2 are increased by making the upper and lower surfaces 2a and 2b of the resin layer 2 coarser than the upper and lower end surfaces of the metal pins 5a and 5b. Therefore, peeling of the wiring patterns 6a and 6b from the resin layer 2, which is a harmful effect when the wiring patterns 6a and 6b are formed by the plating films, can be reduced. The upper and lower end surfaces of the respective metal pins 5a and 5b are not coarser than the upper and lower surfaces 2a and 2b of the resin layer 2. Accordingly, decrease in the connection strengths between the wiring patterns 6a and 6b and the metal pins 5a and 5b, increase in connection resistances therebetween, heat generation and disconnection at the time of energization, and the like, which are caused by cavities generated in the connection portions between the wiring patterns 6a and 6b and the metal pins 5a and 5b, can be suppressed, or decreased.

The wiring patterns 6a and 6b are respectively formed by the two-layer structures of the first metal films 6a1 and 6b1 that are formed by the non-electrolytic plating and the second metal films 6a2 and 6b2 that are formed by the electrolytic plating. Therefore, the first metal film 6a1 is formed on the resin layer 2 with no feeding function and the film thicknesses of the wiring patterns 6a and 6b can be easily increased with the second metal films 6a2 and 6b2 that are formed by the electrolytic plating.

In the embodiment, all of the wiring patterns 6a and 6b and the metal pins 5a and 5b contain Cu as the main components. Therefore, the connection resistances between the wiring patterns 6a and 6b and the metal pins 5a and 5b can be reduced, thereby improving the connection reliability thereof. Furthermore, DC resistance of the coil electrode 4 can be reduced.

The metal pins 5a and 5b are formed by performing the shearing processing or the like on the metal wire and specific resistances of the metal pins 5a and 5b are therefore lower than those of via conductors, post electrodes, and the like. Accordingly, the resistance of the overall inductor electrode 4 can be lowered and inductor characteristics such as the Q value, for example, can be improved.

Second Embodiment

An inductor component according to a second embodiment of the present disclosure will be described with reference to FIG. 4. It should be noted that FIG. 4 is a partial cross-sectional view of the inductor component and corresponds to FIG. 3.

Figure 4:
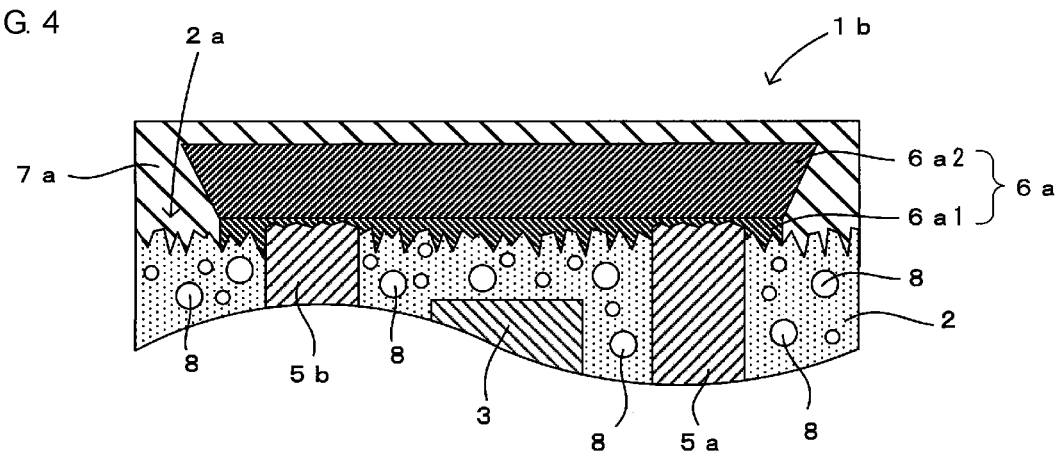
FIG. 4 is a partial cross-sectional view of an inductor component according to a second embodiment of the present disclosure.

An inductor component 1b in the embodiment is different from the inductor component 1a in the first embodiment described with reference to FIG. 1 to FIG. 3 in the configuration of the respective wiring patterns 6a and 6b as illustrated in FIG. 4. Other configurations thereof are the same as those of the inductor component 1a in the first embodiment and description thereof is therefore omitted while the same reference numerals being denoted.

In this case, as illustrated in FIG. 4, cross-sectional shapes of the respective wiring patterns 6a and 6b in the direction perpendicular to the main surface (the upper surface 2a or the lower surface 2b) of the resin layer 2 are shapes of being enlarged in the direction of being farther from the main surfaces of the resin layer 2. The cross-sectional shapes can be formed by the following manufacturing method.

(Method for Manufacturing Inductor Component 1b)

In this case, a wiring electrode formation process is different from that in the method for manufacturing the inductor component 1a in the first embodiment. To be specific, after the upper and lower surfaces 2a and 2b of the resin layer 2 are polished/ground, first copper films (corresponding to a "first metal film" in the present disclosure) are formed on the substantially all of the upper and lower surfaces 2a and 2b of the resin layer 2 by non-electrolytic plating. In this case, the first copper films are formed on not only the upper and lower surfaces 2a and 2b of the resin layer 2 but also the side surfaces thereof.

Then, resist films are laminated on the respective first copper films on the upper and lower surfaces 2a and 2b of the resin layer 2 by a printing method or an exposure method. In this case, the resist films are pattern-formed so as to coat regions other than portions in which the upper and lower wiring pattern 6a or 6b is formed on the respective upper and lower surfaces 2a and 2b of the resin layer 2. Therefore, a plurality of openings having shapes of the respective wiring patterns 6a and 6b are formed in the resist films.

Then, second copper films (corresponding to a "second metal film" in the present disclosure) are laminated on portions of the first copper films, which are coated with no resist film, by electrolytic plating. That is to say, Cu plating is precipitated so as to coat the inside of the respective openings in the resist films. When the resist films are formed, resist portions in which the respective openings are formed spread out with predetermined contact angles with surface tension and the like. When the openings are embedded with the second copper films, the wiring patterns 6a and 6b respectively have the cross-sectional shapes of being enlarged in the direction of being farther from the main surfaces (the upper surface 2a and the lower surface 2b) of the resin layer 2.

Then, the resist films on the upper and lower surfaces 2a and 2b of the resin layer 2 are removed by a wet or dry process.

After that, the portions of the first copper films, which have been coated with the resist films, are removed by wet etching to form the respective upper and lower wiring patterns 6a and 6b.

Then, the insulating coating films 7a and 7b for protecting the respective wiring patterns 6a and 6b are respectively laminated on the upper and lower surfaces 2a and 2b of the resist layer 2 to complete the inductor component 1b.

With this configuration, the wiring patterns 6a and 6b respectively have the cross-sectional shapes of being enlarged in the direction of being farther from the upper surface 2a and the lower surface 2b of the resin layer 2. With the shapes, heat generated in the connection portions between the metal pins 5a and 5b and the wiring patterns 6a and 6b, and the like are easy to be dissipated in the enlarged directions of the wiring patterns 6a and 6b at the time of energization of the coil electrode 4, thereby improving heat dissipation characteristics of the inductor component 1b. In addition, increase in a resistance value of the inductor electrode 4 due to heat at the time of energization can be suppressed, or decreased.

Figure 5:
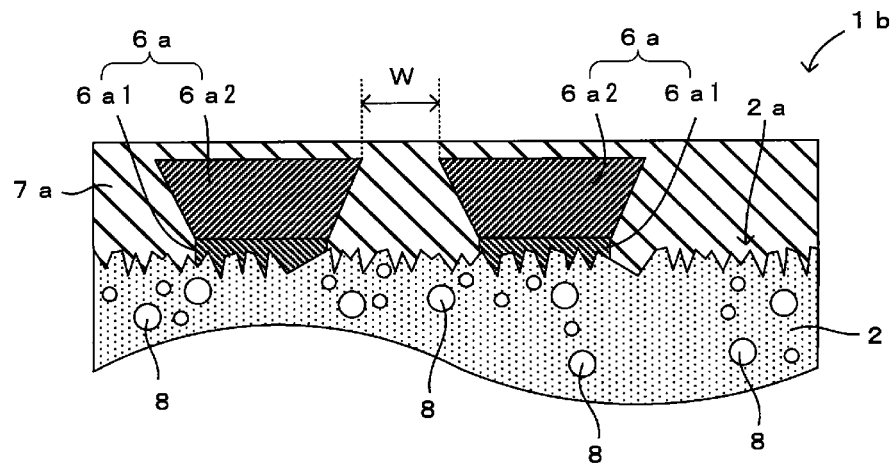
FIG. 5 is a view illustrating adjacent wiring patterns of the inductor component in FIG. 4.

Furthermore, the respective wiring patterns 6a and 6b are formed by pattern formation of the resist films. Therefore, dimensional accuracy of the wiring patterns 6a and 6b can be improved in comparison with the case in which, for example, conductive paste is printed to form wiring patterns. Accordingly, as illustrated in FIG. 5, pitches of the wiring patterns 6a and 6b can be narrowed by decreasing spaces W between the adjacent wiring patterns 6a and 6b.

Third Embodiment

An inductor component according to a third embodiment of the present disclosure will be described with reference to FIG. 6. It should be noted that FIG. 6 is a partial cross-sectional view of the inductor component and corresponds to FIG. 3.

Figure 6:
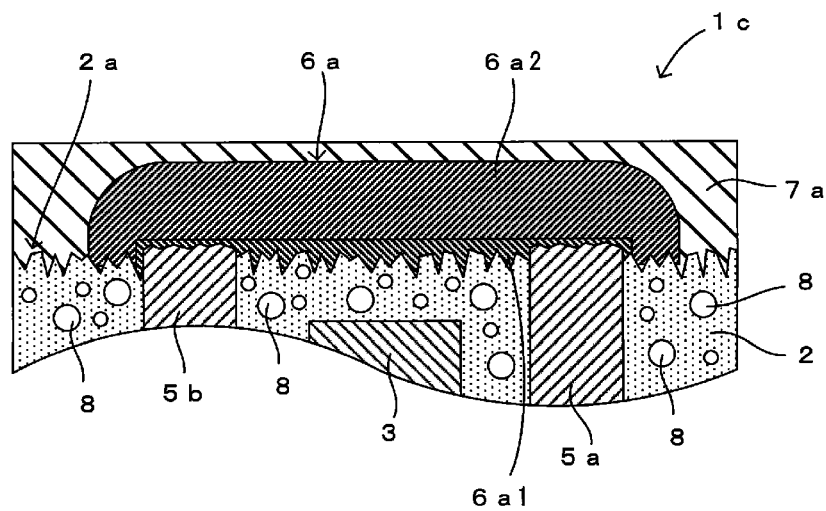
FIG. 6 is a partial cross-sectional view of an inductor component according to a third embodiment of the present disclosure.

An inductor component 1c in the embodiment is different from the inductor component 1a in the first embodiment described with reference to FIG. 1 to FIG. 3 in a formation method of the respective wiring patterns 6a and 6b as illustrated in FIG. 6. Other configurations thereof are the same as those of the inductor component 1a in the first embodiment and description thereof is therefore omitted while the same reference numerals being denoted. A method for manufacturing the inductor component 1c will be described below.

(Method for Manufacturing Inductor Component 1c)

In this case, processes to the process of polishing or grinding the upper and lower surfaces 2a and 2b of the resin layer 2 are the same as those for the inductor component 1a in the first embodiment. Thereafter, first copper films (corresponding to a "first metal film" in the present disclosure) are formed on the substantially all of the upper and lower surfaces 2a and 2b of the resin layer 2 by non-electrolytic plating. In this case, the first copper films are formed on not only the upper and lower surfaces 2a and 2b of the resin layer 2 but also the side surfaces thereof.

Then, portions of the first copper films in which the respective upper and lower wiring patterns 6a and 6b are formed are coated with resist films on the respective upper and lower surfaces 2a and 2b of the resin layer 2. The coating with the resist films can be performed using a printing method or an exposure method.

Then, after portions of the first copper films, which are coated with no resist film, are removed by wet etching, the resist films on the upper and lower surfaces 2a and 2b of the resin layer 2 are removed by a wet or dry process.

After that, second copper films (corresponding to a "second metal film" in the present disclosure) are laminated on the remaining first copper films to form the respective wiring patterns 6a and 6b by electrolytic plating. In this case, the respective wiring patterns 6a and 6b are formed such that end portions thereof form gently curved surfaces, as illustrated in FIG. 6.

Finally, the insulating coating films 7a and 7b for protecting the respective wiring patterns 6a and 6b are respectively laminated on the upper and lower surfaces 2a and 2b of the resist layer 2 to complete the inductor component 1c.

With this configuration, no corner is formed in the end portions of the respective wiring patterns 6a and 6b and the end portions form the gently curved surfaces. Therefore, stress when the coil electrode 4 thermally expands at the time of energization can be dispersed by the curved surfaces of the end portions of the wiring patterns 6a and 6b.

Fourth Embodiment

An inductor component according to a fourth embodiment of the present disclosure will be described with reference to FIG. 7. It should be noted that FIG. 7 is a perspective view of the inductor component.

Figure 7:
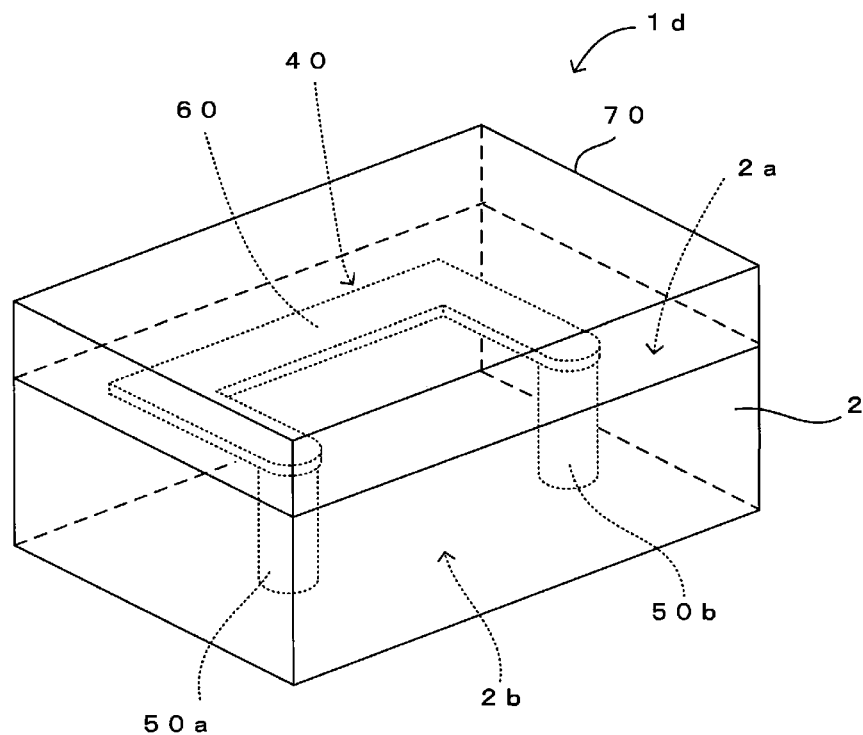
FIG. 7 is a perspective view of an inductor component according to a fourth embodiment of the present disclosure.
Figure 8:
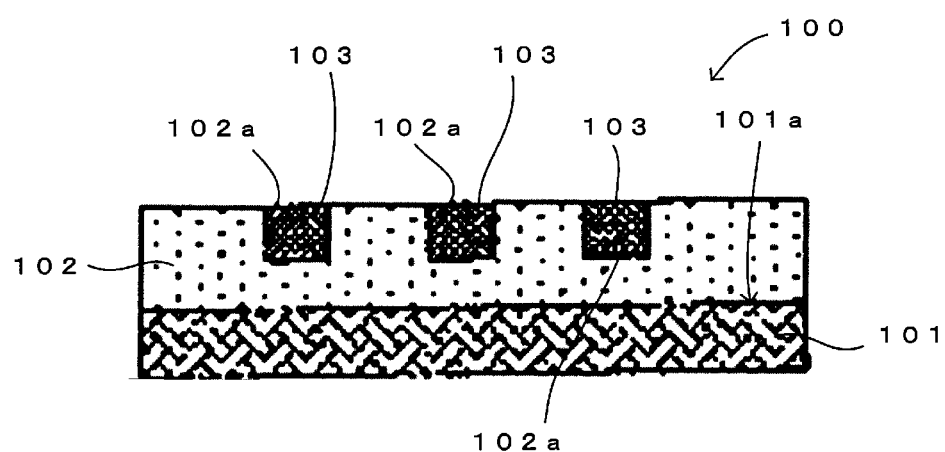
FIG. 8 is a cross-sectional view of an existing printed wiring substrate in which wiring electrodes on a resin layer are formed by plating.

An inductor component 1d in the embodiment is different from the inductor component 1a in the first embodiment described with reference to FIG. 1 to FIG. 3, in the configuration of an inductor electrode 40 and a point that no coil core 3 is provided, as illustrated in FIG. 7. Other configurations thereof are the same as those of the inductor component 1a in the first embodiment and description thereof is therefore omitted while the same reference numerals being denoted.

In this case, the inductor electrode 40 is configured by two metal pins 50a and 50b the upper end surfaces of which are exposed to the upper surface 2a of the resin layer 2 and the lower end surfaces of which are exposed to the lower surface 2b of the resin layer 2 and a U-shaped wiring pattern 60 formed on the upper surface 2a of the resin layer 2 and connecting the upper end surfaces of the two metal pins 50a and 50b when seen from above. Furthermore, an insulating coating film 70 coating the wiring pattern 60 is laminated on the upper surface 2a of the resin layer 2. In the embodiment, the lower end surfaces of both of the metal pins 50a and 50b are exposed to the lower surface 2b of the resin layer 2 and the lower end surfaces are used as electrodes of the inductor component 1d for external connection.

With this configuration, the inductor component 1d in which no coil core 3 is arranged can provide the same effects as those of the inductor component 1a in the first embodiment.

It should be noted that the present disclosure is not limited by the respective embodiments as described above and various changes other than the above-described embodiments can be made without necessarily departing from the gist thereof. For example, each of the wiring patterns 6a, 6b, and 60 may have a single-layer structure. In this case, each of the wiring patterns 6a, 6b, and 60 can be formed only by non-electrolytic plating.

In addition, the first metal films 6a1 and 6b1 and the second metal films 6a2 and 6b2 of the wiring patterns 6a and 6b or 60 may be formed with different metals.

Moreover, the present disclosure can also be applied to not only the wiring patterns 6a and 6b or 60 connecting the end surfaces of the metal pins 5a and 5b or 50a and 50b but also land electrodes for external connection, which are connected to the end surfaces of metal pins.

Although the resin layer 2 contains the filler in the above-described respective embodiments, the resin layer 2 may not necessarily contain the filler as long as the surface roughnesses of the upper and lower surfaces 2a and 2b of the resin layer 2 are larger than those of the upper and lower end surfaces of the metal pins 5a and 5b or 50a and 50b.

Furthermore, the insulating coating films 7a and 7b or 70 may not be provided.

INDUSTRIAL APPLICABILITY

The present disclosure can be widely applied to various inductor components each including a resin layer and an inductor electrode.

REFERENCE SIGNS LIST 1a to 1d INDUCTOR COMPONENT
2 RESIN LAYER
2a UPPER SURFACE (MAIN SURFACE)
2b LOWER SURFACE (MAIN SURFACE)
3 COIL CORE
4 COIL ELECTRODE (INDUCTOR ELECTRODE)
5a, 5b, 50a, 50b METAL PIN (FIRST AND SECOND COLUMNAR CONDUCTORS)
6a, 6b, 60 WIRING PATTERN (PLATING LAYER)
6a1, 6b1 FIRST METAL FILM
6a2, 6b2 SECOND METAL FILM
8 FILLER
40 INDUCTOR ELECTRODE

The invention claimed is:

1. An inductor component comprising a resin layer and an inductor electrode,
   wherein the inductor electrode includes:
      a first columnar conductor arranged in the resin layer so that an end surface of the first columnar conductor is exposed to a main surface of the resin layer; and
      a plating layer having a portion making contact with the end surface of the first columnar conductor and a portion making contact with the main surface of the resin layer,
   wherein surface roughness of the main surface of the resin layer is larger than surface roughness of the end surface of the first columnar conductor.

2. The inductor component according to claim 1,
   wherein the plating layer includes a first metal film arranged on the main surface of the resin layer and a second metal film laminated on the first metal film.

3. The inductor component according to claim 2,
   wherein the plating layer and the first columnar conductor contain the same metal as main components.

4. The inductor component according to claim 2,
wherein the inductor electrode further includes a second columnar conductor arranged in the resin layer so that an end surface is exposed to the main surface of the resin layer, and
wherein the plating layer further has a portion making contact with the end surface of the second columnar conductor and connects the first columnar conductor and the second columnar conductor.

5. The inductor component according to claim 2,
wherein the plating layer has a cross-sectional shape that becomes enlarged in a direction away from the main surface of the resin layer.

6. The inductor component according to claim 1,
wherein a main component of the plating layer is metal, and a main component of the first columnar conductor is the same metal.

7. The inductor component according to claim 6,
wherein the main component is copper.

8. The inductor component according to claim 7,
wherein the inductor electrode further includes a second columnar conductor arranged in the resin layer so that an end surface is exposed to the main surface of the resin layer, and
wherein the plating layer further has a portion making contact with the end surface of the second columnar conductor and connects the first columnar conductor and the second columnar conductor.

9. The inductor component according to claim 7,
wherein the plating layer has a cross-sectional shape that becomes enlarged in a direction away from the main surface of the resin layer.

10. The inductor component according to claim 6,
wherein the inductor electrode further includes a second columnar conductor arranged in the resin layer so that an end surface is exposed to the main surface of the resin layer, and
wherein the plating layer further has a portion making contact with the end surface of the second columnar conductor and connects the first columnar conductor and the second columnar conductor.

11. The inductor component according to claim 6,
wherein the plating layer has a cross-sectional shape that becomes enlarged in a direction away from the main surface of the resin layer.

12. The inductor component according to claim 1,
wherein the inductor electrode further includes a second columnar conductor arranged in the resin layer so that an end surface is exposed to the main surface of the resin layer, and
wherein the plating layer further has a portion making contact with the end surface of the second columnar conductor and connects the first columnar conductor and the second columnar conductor.

13. The inductor component according to claim 12,
wherein a coil core is arranged between the first columnar conductor and the second columnar conductor.

14. The inductor component according to claim 12,
wherein the plating layer has a cross-sectional shape that becomes enlarged in a direction away from the main surface of the resin layer.

15. The inductor component according to claim 1,
wherein the plating layer has a cross-sectional shape that becomes enlarged in a direction away from the main surface of the resin layer.

16. The inductor component according to claim 1,
wherein the first columnar conductor is a metal pin.

17. The inductor component according to claim 16,
wherein a resistance of the metal pin is lower than a resistance of a conductor formed by conductive paste.

18. The inductor component according to claim 16,
wherein a resistance of the inductor electrode is lower than a resistance of an inductor electrode having a conductor formed by conductive paste.

19. The inductor component according to claim 16,
wherein a Q value of the inductor electrode is higher than a Q value of an inductor electrode having a conductor formed by conductive paste.

20. A method for manufacturing an inductor component that includes a resin layer and an inductor electrode having a first columnar conductor arranged in the resin layer and a wiring electrode formed on a main surface of the resin layer, the method comprising:
arranging the first columnar conductor in the resin layer containing a filler;
polishing or grinding the main surface of the resin layer to expose an end surface of the first columnar conductor to the main surface; and
forming, on the main surface of the resin layer by plating, the wiring electrode having a portion making contact with the end surface of the first columnar conductor and a portion making contact with the main surface of the resin layer,
wherein in the polishing or grinding, the filler in the main surface of the resin layer is shed at the time of polishing or grinding to make surface roughness of the main surface of the resin layer be larger than surface roughness of the end surface of the first columnar conductor.

21. The method for manufacturing the inductor component according to claim 9,
wherein the forming of the wiring electrode includes:
forming a first metal film coating substantially all of the main surface of the resin layer by non-electrolytic plating;
laminating a second metal film on the first metal film by electrolytic plating;
coating, with a resist film, a region of the second metal film in which the wiring electrode is to be formed; and
removing a portion of the first metal film and the second metal film, which is not coated with the resist film, by etching.

22. The method for manufacturing the inductor component according to claim 9,
wherein the forming of the wiring electrode includes:
forming a first metal film coating substantially all of the main surface of the resin layer by non-electrolytic plating;
coating, with a resist film, a portion of the first metal film other than a portion in which the wiring electrode is to be formed;
laminating a second metal film on a portion of the first metal film, which is not coated with the resist film, by electrolytic plating;
removing the resist film; and
removing a portion of the first metal film, which has been coated with the resist film, by etching.

23. The method for manufacturing the inductor component according to claim 9,
wherein the forming of the wiring electrode includes:
forming a first metal film coating substantially all of the main surface of the resin layer by non-electrolytic plating;

coating, with a resist film, a portion of the first metal film in which the wiring electrode is to be formed;

removing a portion of the first metal film, which is not coated with the resist film, by etching;

removing the resist film; and laminating a second metal film on a portion of the first metal film, which remains in the etching, by electrolytic plating.

* * * * *